United States Patent
Mylavarapu

(10) Patent No.: US 10,176,860 B1
(45) Date of Patent: Jan. 8, 2019

(54) REFRESH IN NON-VOLATILE MEMORY

(71) Applicant: Micron Technology, Inc., Boise, ID (US)

(72) Inventor: Sai Krishna Mylavarapu, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/688,945

(22) Filed: Aug. 29, 2017

(51) Int. Cl.
*G11C 7/00* (2006.01)
*G11C 11/401* (2006.01)
*G06F 12/02* (2006.01)

(52) U.S. Cl.
CPC ........ *G11C 11/401* (2013.01); *G06F 12/0246* (2013.01)

(58) Field of Classification Search
CPC ............ G11C 11/406; G11C 11/40615; G11C 11/40626; G11C 11/40611; G11C 16/3431; G11C 16/3418; G11C 13/0033; G11C 16/26; G11C 13/0004; G11C 11/56; G11C 16/349; G11C 13/0069; G11C 13/0035; G11C 16/00; G11C 29/026
See application file for complete search history.

(56) References Cited

U.S. PATENT DOCUMENTS

| | | | |
|---|---|---|---|
| 6,396,744 B1 | 5/2002 | Wong | |
| 6,744,676 B2* | 6/2004 | Leung | G11C 5/147 257/E21.015 |
| 6,751,127 B1 | 6/2004 | Chou et al. | |
| 6,931,480 B2 | 8/2005 | Swaminathan | |
| 7,233,538 B1* | 6/2007 | Wu | G11C 11/406 365/222 |
| 7,286,377 B1* | 10/2007 | Pyeon | G11C 7/04 365/189.09 |
| 7,325,090 B2 | 1/2008 | Ronen | |
| 7,990,795 B2* | 8/2011 | Pelley, III | G11C 11/406 365/201 |
| 8,261,136 B2 | 9/2012 | D'Abreu et al. | |
| 8,650,353 B2 | 2/2014 | Belgal et al. | |
| 9,076,504 B2* | 7/2015 | Lee | G11C 7/08 |
| 9,129,699 B2 | 9/2015 | Suzuki et al. | |
| 2009/0172267 A1 | 7/2009 | Oribe et al. | |
| 2017/0140810 A1* | 5/2017 | Choi | G11C 11/40603 |

* cited by examiner

*Primary Examiner* — Hien Nguyen
(74) *Attorney, Agent, or Firm* — Brooks, Cameron & Huebsch, PLLC

(57) ABSTRACT

The present disclosure includes apparatuses and methods related to refresh in memory. An example apparatus can refresh a memory cell of an array of memory cells in response to the array of memory cells being accessed a threshold number of accesses.

34 Claims, 4 Drawing Sheets ical Field

The present disclosure relates generally to memory devices, and more particularly, to apparatuses and methods for refreshing in non-volatile memory.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

Memory can be part of a memory module (e.g., a dual in-line memory module (DIMM)) used in computing devices. Memory modules can include volatile, such as DRAM, for example, and/or non-volatile memory, such as Flash memory or RRAM, for example. The DIMMs can be using a main memory in computing systems.

DETAILED DESCRIPTION

Figure 1A:
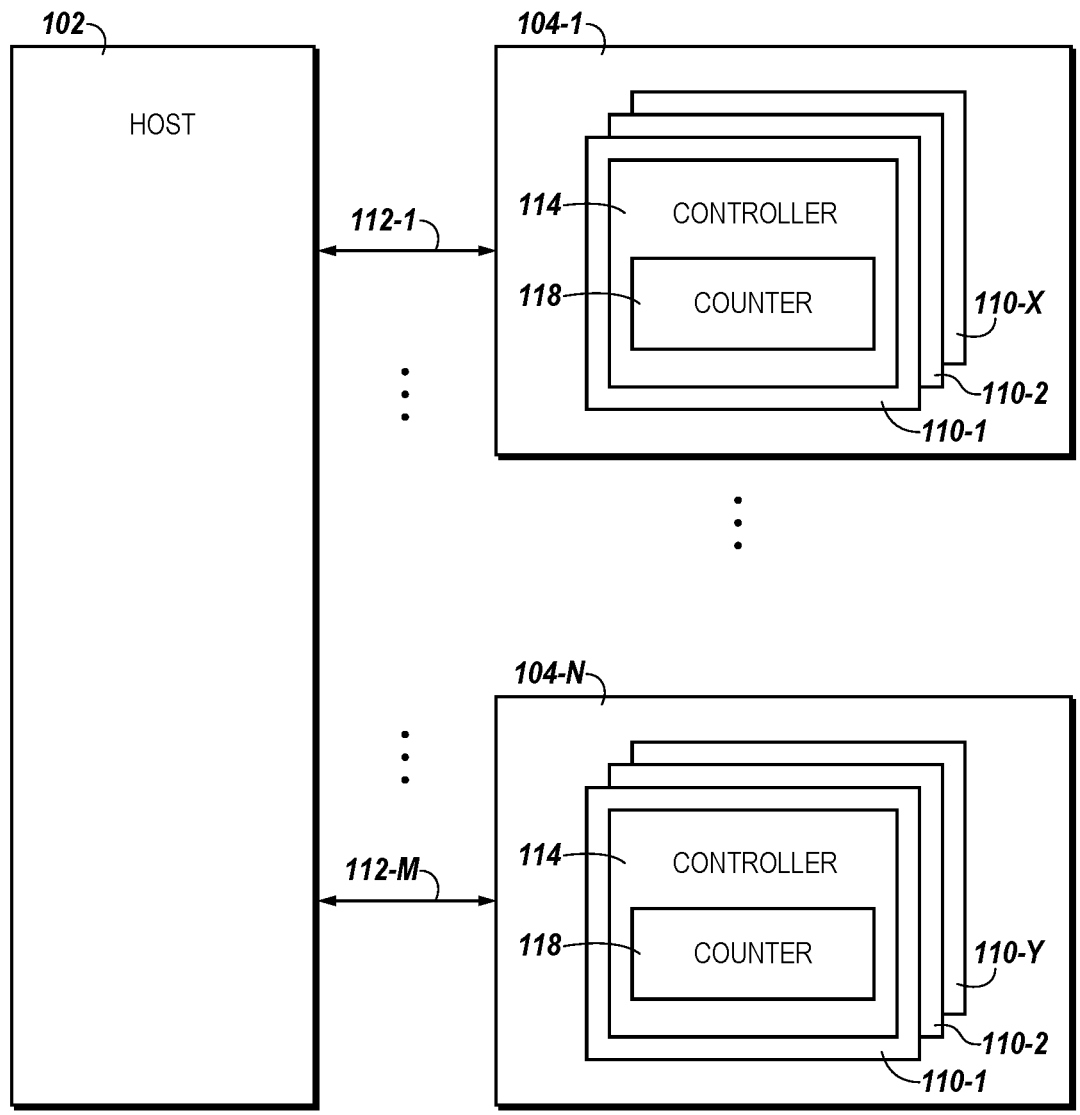
FIG. 1A is a block diagram of an apparatus in the form of a computing system including a memory system in accordance with a number of embodiments of the present disclosure.

The present disclosure includes apparatuses and methods related to refresh operations in memory. An example apparatus can refresh a memory cell of an array of memory cells in response to the array of memory cells being accessed a threshold number of accesses.

In one or more embodiments of the present disclosure, a controller can be configured to determine a refresh rate of the array of memory cells and refresh a memory cell of the array of memory cells in response to the array of memory cells being accessed a threshold number of accesses. The threshold of memory cells of the array of memory cells being accessed can include, for example, background accesses and host accesses. The threshold can be based on the refresh rate. The controller can be configured to determine the refresh rate to reduce write amplification. The controller can be configured to determine refresh rate based on a threshold miss rate. For example, the miss rate can be based on a number of memory cells that fail to refresh within a threshold number of accesses for the particular memory cell. For example, a particular memory cell can fail if it is accessed a threshold number of times without being refreshed. Therefore the miss rate is a determination of a number of cells that were not refreshed before being accessed at least the threshold number of times for the particular memory cells. The controller can be configured to reduce the miss rate by increasing the refresh rate. For example, the controller can be configured to determine the refresh rate that makes the threshold 500 accesses or more based on a threshold miss rate.

In one or more embodiments of the present disclosure, a refresh rate can be at most 1/T, where T can be the number of times a memory cell can be accessed before it will fail if not refreshed.

In one or more embodiments of the present disclosure, a controller can be configured to determine a refresh rate based on a type of workload and/or data. The type of workload can be identified by the controller based on the location of accesses and/or the rate of accesses. The controller can be configured to determine a refresh rate based on a static workload and/or determine the refresh rate based on a dynamic workload. The refresh rate can be determined at start up of the memory device and/or periodically while the memory device is being used. A memory device with a static workload can have an access rate that may be approximately constant and the locations of the accesses can be substantially uniformly distributed throughout the array. A memory device with a dynamic workload can have an access rate that varies and the locations of the accesses may not be uniformly distributed throughout the array. In one or more embodiments of the present disclosure, the refresh rate can be determined periodically based on dynamic data and/or static data. For example, dynamic data can be data that changes frequently and static data can be data that doesn't change frequently.

In one or more embodiments of the present disclosure, a controller can be configured to refresh a memory cell of an array of memory cells that was last accessed. The controller can be configured to refresh the memory cell of the array of memory cells that was last accessed to protect the array of memory cells from attack. Attacks, for example, that continuously access a memory cell or a number of memory cells. The controller can also be configured to refresh the memory cell of the array of memory cells that was last accessed to protect the array of memory cells from heavy access loads that continuously access a memory cell or a number of memory cells.

In one or more embodiments of the present disclosure, the controller can be configured to refresh a randomly selected memory cell of the array of memory cells. In one or more embodiments of the present disclosure, the apparatus can include a counter. The counter can be a global counter that determines how many times a memory device is access by the controller. The controller can be configured to refresh a memory cell with an access count that is above a threshold and/or the highest access count of the array. The access count can be determined via the counter.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more of such things. For example, a number of memory devices can refer to one or more of memory devices. Additionally, designators such as "M", "S", "T", "X", "Y", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1A is a functional block diagram of a computing system including an apparatus in the form of a number of memory systems 104-1 . . . 104-N, in accordance with one or more embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In the embodiment illustrated in FIG. 1A, memory systems 104-1 . . . 104-N can include a one or more memory devices, such as memory devices 110-1, . . . , 110-X, 110-Y. The memory devices 110-1, . . . , 110-X, 110-Y can include volatile memory and/or non-volatile memory. In a number of embodiments, memory systems 104-1, . . . , 104-N can include a multi-chip device. A multi-chip device can include a number of different memory types and/or memory modules. For example, a memory system can include non-volatile or volatile memory on any type of a module. In FIG. 1A, memory system 104-1 is coupled to the host 102 via channels 112-1 and can include memory devices 110-1, . . . , 110-X. For example, memory device 110-1 can be a non-volatile cross-point array memory device and 110-X can be a NAND flash memory device. In this example, each memory device 110-1, . . . , 110-X, 110-Y includes a controller 114. Controller 114 can receive commands from host 102 and control execution of the commands on a memory device. The host 102 can send commands to the memory devices 110-1, . . . , 110-X, 110-Y. For example, the host can communicate on the same channel (e.g., channel 112-1) with a non-volatile cross-point array memory device and a NAND flash memory device that are both on the same memory system.

As illustrated in FIG. 1A, a host 102 can be coupled to the memory systems 104-1 . . . 104-N. In a number of embodiments, each memory system 104-1 . . . 104-N can be coupled to host 102 via a channel. In FIG. 1A, memory system 104-1 is coupled to host 102 via channel 112-1 and memory system 104-N is coupled to host 102 via channel 112-M. Host 102 can be a laptop computer, personal computers, digital camera, digital recording and playback device, mobile telephone, PDA, memory card reader, interface hub, among other host systems, and can include a memory access device (e.g., a processor). One of ordinary skill in the art will appreciate that "a processor" can intend one or more processors, such as a parallel processing system, a number of coprocessors, etc.

Host 102 can send commands to the memory devices 110-1, . . . , 110-X, 110-Y via channels 112-1 . . . 112-M. The host 102 can communicate with the memory devices 110-1, . . . , 110-X, 110-Y and/or the controller 114 on each of the memory devices 110-1, . . . , 110-X, 110-Y to read, write, and erase data, among other operations. A physical host interface can provide an interface for passing control, address, data, and other signals between the memory systems 104-1 . . . 104-N and host 102 having compatible receptors for the physical host interface. The signals can be communicated between host 102 and memory devices 110-1, . . . , 110-X, 110-Y on a number of buses, such as a data bus and/or an address bus, for example, via channels 112-1 . . . 112-M.

The host 102 and/or controller 114 on a memory device can include control circuitry (e.g., hardware, firmware, and/or software). In one or more embodiments, the host 102 and/or controller 114 can be an application specific integrated circuit (ASIC) coupled to a printed circuit board including a physical interface. Also, each memory device 110-1, . . . , 110-X, 110-Y can include a counter 118. Counter 118 can count number of times a memory device and/or an array of memory cells is accessed. Counter 118 can be a global counter that is used by the controller to determine a count of the number of times a controller accesses a memory device and/or an array of memory cells (e.g. reads and/or write data). Counter 118 can be used to determine when to refresh a memory cell in the memory device, among other functions of the controller. Counter 118 can be part of a self-monitoring, analysis and reporting technology (SMART) system that is used to control host and background accesses to the memory devices 110-1, . . . , 110-X, 110-Y.

The memory devices 110-1, . . . , 110-X, 110-Y can provide main memory for the memory system or could be used as additional memory or storage throughout the memory system. Each memory device 110-1, . . . , 110-X, 110-Y can include one or more arrays of memory cells (e.g., non-volatile memory cells). The arrays can be flash arrays with a NAND architecture, for example. Embodiments are not limited to a particular type of memory device. For instance, the memory device can include RAM, ROM, DRAM, SDRAM, PCRAM, RRAM, and flash memory, among others.

The embodiment of FIG. 1A can include additional circuitry that is not illustrated so as not to obscure embodiments of the present disclosure. For example, the memory systems 104-1 . . . 104-N can include address circuitry to latch address signals provided over I/O connections through I/O circuitry. Address signals can be received and decoded by a row decoder and a column decoder to access the memory devices 110-1, . . . , 110-X, 110-Y. It will be appreciated by those skilled in the art that the number of address input connections can depend on the density and architecture of the memory devices 110-1, . . . , 110-X, 110-Y.

Figure 1B:
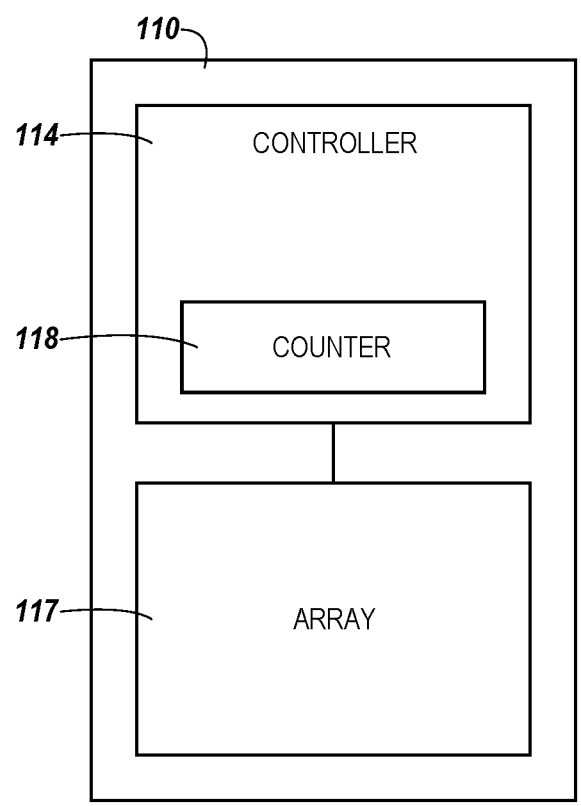
FIG. 1B is a block diagram of an apparatus in the form of a memory device in accordance with a number of embodiments of the present disclosure.

FIG. 1B is a block diagram of an apparatus in the form of a memory device in accordance with a number of embodiments of the present disclosure. In FIG. 1B, memory device 110 can include a controller 114 and an array of memory cells 117. The controller 114 can be configured to refresh a memory cell of the array of memory cells in response to the array of memory cells being accessed a threshold number of accesses. The controller 114 can include a counter 118. The controller 114 can be configured to refresh a memory cell with an access count that is above a threshold and/or the highest access count of the array of memory cells 117. The access count can be determined via the counter 118. The controller 114 can be configured to refresh the memory cell that was last accessed in response to the array of memory cells 117 being accessed a threshold number of accesses since a prior refresh, as determined by the counter 118.

In one or more embodiments of the present disclosure, a controller 114 can be configured to determine a refresh rate of the array of memory cells 117 and refresh a memory cell of the array of memory cells 117 in response to the array of memory cells 117 being accessed a threshold number of accesses.

In one or more embodiments of the present disclosure, the threshold of memory cells of the array of memory cells 117 being accessed can include, for example, background accesses and host accesses. The threshold can be based on the refresh rate. The controller 114 can be configured to determine the refresh rate to reduce write amplification. The controller 114 can also be configured to determine refresh rate based on a threshold miss rate.

The refresh rate can be set statically and/or dynamically. For example, a static refresh rate can be at most 1/T, where T can be the number of times a memory cell can be accessed before it will fail if not refreshed. A dynamic refresh rate can be set periodically based on the type of workload. For example, the controller 114 can be configured to periodically determine a refresh rate based on a static workload and/or a dynamic workload.

In one or more embodiments of the present disclosure, the refresh rate can be determined dynamically based on a type of workload performed by a memory device and/or a type of data stored on an array of memory cells 117. For example, memory device can include dynamic data that changes frequently and/or static data that changes infrequently (e.g., less frequently than dynamic data).

In one or more embodiments of the present disclosure, a controller 114 can be configured to refresh a memory cell of an array of memory cells 117 that was last accessed. The controller 114 can be configured to refresh the memory cell of the array of memory cells 117 that was last accessed to protect the array of memory cells 117 from attack. Attacks, for example, can continuously access a memory cell or a number of memory cells of the array of memory cells 117. The controller 114 can also be configured to refresh the memory cell of the array of memory cells 117 that was last accessed to protect the array of memory cells 117 from heavy access loads that continuously access a memory cell or a number of memory cells of the array of memory cells 117.

Figure 2:
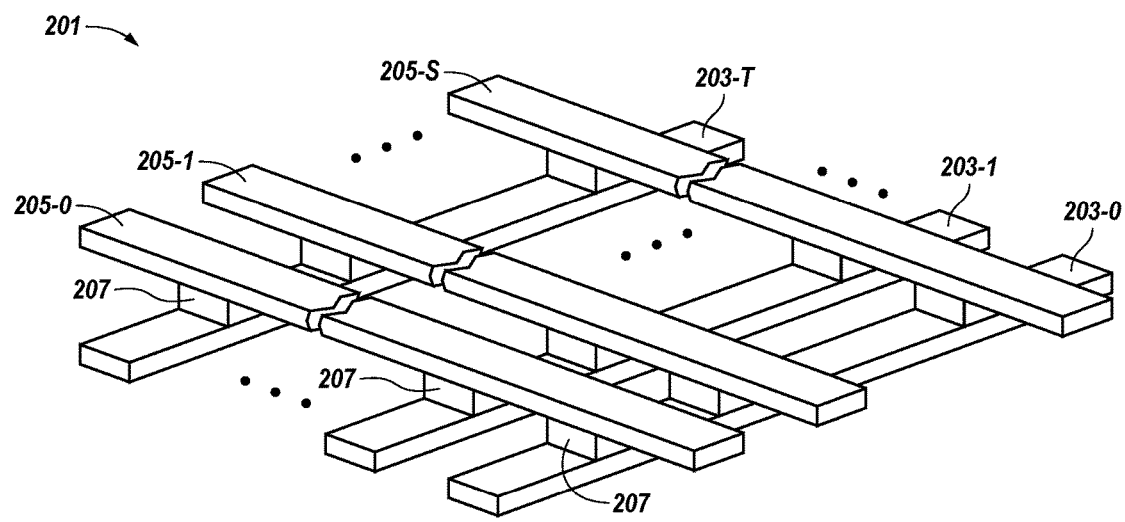
FIG. 2 is a diagram of a portion of an array of memory cells in accordance with a number of embodiments of the present disclosure.

FIG. 2 is a block diagram of a portion of an array 217 of memory cells 207 in accordance with a number of embodiments of the present disclosure. The array 217 can be a two terminal cross-point array having memory cells 207 located at the intersections of a first plurality of conductive lines (e.g., access lines) 203-0, 203-1, . . . , 203-T, which may be referred to herein as word lines, and a second plurality of conductive lines (e.g., data/sense lines, 205-0, 205-1, . . . , 205-M) which may be referred to herein as bit lines. The designators N and M can have various values. Embodiments are not limited to a particular number of word lines and/or bit lines. As illustrated, the word lines 203-0, 203-1, . . . , 203-T are parallel to each other and are orthogonal to the bit lines 205-0, 205-1, . . . , 205-S, which are substantially parallel to each other; however, embodiments are not so limited. The conductive lines can include conductive material (e.g., a metal material). Examples of the conductive material include, but are not limited to, tungsten, copper, titanium, aluminum, and/or combinations thereof, among other conductive materials.

Each memory cell 207 may include a memory element (e.g., a resistive memory element) coupled in series with a select device (e.g., an access device) in accordance with a number of embodiments described herein. The memory element and the select device are discussed further herein.

The select devices can be operated (e.g., turned on/off) to select/deselect the memory element in order to perform operations such as data programming (e.g., writing, and/or data sensing (e.g., reading operations)). The select device can be a diode, a bipolar junction transistor, a MOS transistor, and/or an Ovonic threshold switch, among other devices. In operation, appropriate voltage and/or current signals (e.g., pulses) can be applied to the bit lines and word lines in order to program data to and/or read data from the memory cells 207. The memory cells 207 can be programmed to a set state (e.g., low resistance) or a reset state (e.g., high resistance). As an example, the data stored by a memory cell 207 of array 217 can be determined by turning on a select device and sensing a current through the memory element. The current sensed on the bit line corresponding to the memory cell 207 being read corresponds to a resistance level of the memory element (e.g., a resistance level of a resistance variable material) which in turn may correspond to a particular data state (e.g., a binary value). The array 217 can have an architecture other than that illustrated in FIG. 2, as will be understood by one of ordinary skill in the art.

The array 217 can be a two dimensional array. For example, the memory cells 207 of the array 217 can be arranged between the access lines, 203-0, 203-1, . . . , 203-T and the data/sense lines, 205-0, 205-1, . . . , 205-S in a single level. The array 217 can be a three dimensional array. For example, the memory cells of the array can be arranged in multiple levels, where each of the multiple levels has memory cells organized in a cross point architecture. For three dimensional array embodiments of the present disclosure, a vertical string of memory cells can be coupled to a data line and a plurality of access lines coupled to the vertical string of memory cells, for instance.

The access lines 203-0, 203-1, . . . , 203-T and the data/sense lines 205-0, 205-1, . . . , 205-S can be coupled to decoding circuits formed in a substrate material (e.g., formed adjacent to or for example below) the array 217 and used to interpret various signals (e.g., voltages and/or currents) on the access lines and/or the data/sense lines. As an example, the decoding circuits may include row decoding circuits for decoding signals on the access lines, and column decoding circuits for decoding signals on the data/sense lines.

As used in the present disclosure, the term substrate material can include silicon-on-insulator (SOI) or silicon-on-sapphire (SOS) technology, doped and undoped semiconductors, epitaxial layers of silicon supported by a base semiconductor foundation, conventional metal oxide semiconductors (CMOS) (e.g., a CMOS front end with a metal backend) and/or other semiconductor structures and technologies. Various elements (e.g., transistors, and/or circuitry), such as decode circuitry for instance, associated with operating the array 217 can be formed in/on the substrate material such as via process steps to form regions or junctions in the base semiconductor structure or foundation.

The memory cells 207 can be formed using various processing techniques such as atomic material deposition (ALD), physical vapor deposition (PVD), chemical vapor deposition (CVD), supercritical fluid deposition (SFD), molecular beam expitaxy (MBE), patterning, etching, filling, chemical mechanical planarization (CMP), combinations thereof, and/or other suitable processes. In accordance with a number of embodiments of the present disclosure, materials may be grown in situ.

Figure 3:
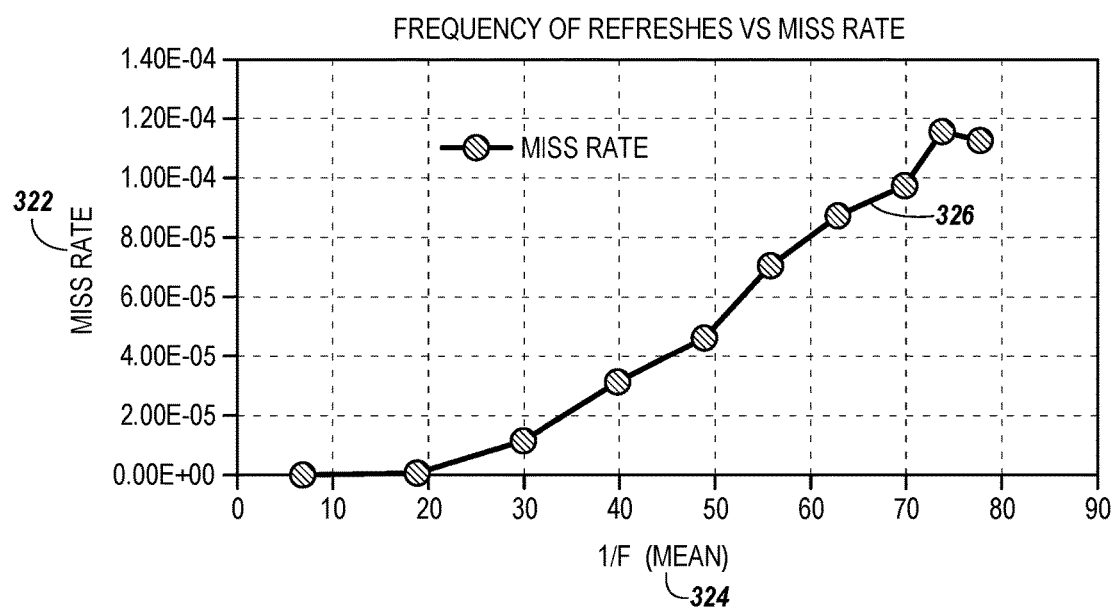
FIG. 3 illustrates a diagram associated with frequency of refreshes versus miss rate in memory in accordance with a number of embodiments of the present disclosure.

FIG. 3 illustrates a diagram associated with frequency of refreshes versus miss rate in memory in accordance with a number of embodiments of the present disclosure. The controller (e.g. controller 114 in FIG. 1B) can be configured to determine a refresh rate 324 based on a threshold miss rate 322. For example, the miss rate 322 can be based on a number of memory cells of an array of memory cells (e.g. array of memory cells 117 in FIG. 1B) that fail to refresh within a threshold number of accesses. The controller can be configured to reduce the miss rate by increasing the refresh rate. For example, the controller can be configured to determine the refresh rate that makes the miss rate 7.00E-05. At a miss rate of 7.00E-05 line 326 is around a refresh rate of 55. If the desired miss rate is 3.00E-05, the refresh rate would be 40. As illustrated in FIG. 3 the miss rate decreases as the refresh rate increases.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
an array of memory cells;
a counter configured to:
 determine an access count of the array of memory cells; and
a controller configured to:
 refresh a memory cell of the array of memory cells in response to the access count of the array of memory cells being a threshold number.

2. The apparatus of claim 1, wherein the controller is configured to determine a refresh rate based on the threshold number.

3. The apparatus of claim 1, wherein the controller is configured to determine refresh rate based on a threshold miss rate.

4. The apparatus of claim 2, wherein the controller is configured to determine the refresh rate based on a static workload.

5. The apparatus of claim 2, wherein the controller is configured to determine the refresh rate periodically based on a dynamic workload.

6. The apparatus of claim 2, wherein the controller is configured to identify a type of workload based on locations of accesses and an access rate.

7. The apparatus of claim 2, wherein the controller is configured to determine the refresh rate periodically based on dynamic data.

8. The apparatus of claim 2, wherein the controller is configured to determine the refresh rate periodically based on a type of workload.

9. An apparatus, comprising:
an array of memory cells;
a counter configured to:
 determine an access count of the array of memory cells; and
a controller configured to:
 determine a refresh rate of the array of memory cells; and
 refresh a memory cell of the array of memory cells in response to the access count of the array of memory cells being a threshold number, wherein the threshold number is based on the refresh rate.

10. The apparatus of claim 9, wherein the controller is configured to refresh the memory cell of the array of memory cells that was last accessed.

11. The apparatus of claim 9, wherein the controller is configured to refresh a randomly selected memory cell of the array of memory cells.

12. The apparatus of claim 9, wherein the controller is configured to refresh a memory cell with an access count that is above the threshold number.

13. The apparatus of claim 9, wherein the counter is included in a self-monitoring, analysis and reporting technology (SMART) system used to control host and background accesses.

14. An apparatus, comprising:
an array of memory cells;
a counter configured to:
 determine an access count of the array of memory cells; and
a controller configured to:
 determine a refresh rate of the array of memory cells; and
 refresh a memory cell of the array of memory cells that was last accessed in response to the access count of the array of memory cells being a threshold number, wherein the threshold number is based on the refresh rate and the refresh rate is based on a miss rate of the array of memory cells.

15. The apparatus of claim 14, wherein the controller is configured to determine the refresh rate based on a threshold miss rate.

16. The apparatus of claim 14, wherein the controller is configured to determine the miss rate based on a number of memory cells that fail to refresh within the threshold number.

17. The apparatus of claim 14, wherein the controller is configured to reduce the miss rate by increasing the refresh rate.

18. The apparatus of claim 14, wherein the controller is configured to determine the refresh rate to reduce write amplification.

19. The apparatus of claim 14, wherein the controller is configured to determine the refresh rate that increases the threshold number based on a threshold miss rate.

20. The apparatus of claim 14, wherein the controller is configured to determine the refresh rate that makes the threshold number 500 accesses or more based on a threshold miss rate.

21. The apparatus of claim 14, wherein the controller is configured to refresh the memory cell of the array of memory cells that was last accessed to protect the array of memory cells from attacks that continuously access a memory cell or a number of memory cells.

22. The apparatus of claim 14, wherein the controller is configured to refresh the memory cell of the array of memory cells that was last accessed to protect the array of memory cells from heavy access loads that continuously access a memory cell or a number of memory cells.

23. A method, comprising:
accessing a memory cell of an array of memory cells; and
refreshing the memory cell of the array of memory cells in response to an access count of the array of memory cells being a threshold number.

24. The method of claim 23, further comprising determining a refresh rate based on the threshold number.

25. The method of claim 23, further comprising determining a refresh rate based on a threshold miss rate.

26. The method of claim 25, further comprising determining the refresh rate based on a static workload by access locations and rate of accesses.

27. The method of claim 25, further comprising determining the refresh rate based on a dynamic workload by access locations and access rate.

28. A method, comprising:
determining a refresh rate of an array of memory cells;
accessing a memory cell of the array of memory cells; and
refreshing the memory cell of the array of memory cells in response to an access count of the array of memory cells being a threshold number, wherein the threshold number is based on the refresh rate and the refresh rate is based on a miss rate of the array of memory cells.

29. The method of claim 28, wherein the threshold number includes background accesses and host accesses.

30. The method of claim 28, further comprising determining the refresh rate based on a number of memory cells that fail to refresh within the threshold number.

31. The method of claim 28, further comprising increasing the threshold number to decrease the miss rate.

32. The method of claim 28, further comprising determining the refresh rate to decrease write amplification.

33. The method of claim 28, further comprising refreshing the memory cell of the array to protect the array of memory cells from attacks that continuously access a memory cell or a number of memory cells.

34. The method of claim 28, further comprising refreshing the memory cell of the array of memory cells to protect the array of memory cells from heavy access loads that continuously access a memory cell or a number of memory cells.

* * * * *